United States Patent
Yamada

(10) Patent No.: US 9,123,867 B2
(45) Date of Patent: Sep. 1, 2015

(54) LIGHT EMITTING DEVICE

(75) Inventor: Motokazu Yamada, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 13/360,280

(22) Filed: Jan. 27, 2012

(65) Prior Publication Data

US 2012/0193665 A1   Aug. 2, 2012

(30) Foreign Application Priority Data

Jan. 28, 2011   (JP) ................. 2011-016420

(51) Int. Cl.
| | |
|---|---|
| *H01L 33/60* | (2010.01) |
| *H01L 33/58* | (2010.01) |
| *H01L 33/46* | (2010.01) |
| *H01L 23/00* | (2006.01) |
| H01L 25/16 | (2006.01) |
| H01L 33/50 | (2010.01) |
| H01L 33/54 | (2010.01) |
| H01L 33/62 | (2010.01) |

(52) U.S. Cl.
CPC ............... *H01L 33/46* (2013.01); *H01L 24/17* (2013.01); *H01L 24/97* (2013.01); *H01L 25/167* (2013.01); *H01L 33/505* (2013.01); *H01L 33/507* (2013.01); *H01L 33/54* (2013.01); *H01L 33/60* (2013.01); *H01L 33/62* (2013.01); *H01L 2224/16225* (2013.01); *H01L 2224/32225* (2013.01); *H01L 2224/73204* (2013.01); *H01L 2924/01012* (2013.01); *H01L 2924/01029* (2013.01); *H01L 2924/12041* (2013.01)

(58) Field of Classification Search
CPC ....... H01L 33/60; H01L 33/58; H01L 33/486; H01L 33/642; H01L 33/405; H01L 33/50; H01L 24/97; H01L 33/382; H01L 29/78603
USPC ...................................... 257/98, 99
See application file for complete search history.

(56) References Cited

U.S. PATENT DOCUMENTS 7,045,828 B2 *   5/2006   Shimizu et al. ................. 257/98
7,101,061 B2 *   9/2006   Nagai et al. .................... 362/294

(Continued)

FOREIGN PATENT DOCUMENTS

| EP | 1 978 566 A1 | 10/2008 |
|---|---|---|
| JP | 2004-55632 | 2/2004 |

(Continued)

OTHER PUBLICATIONS

European Search Report EP 12152837.6 dated Jun. 22, 2012.

(Continued)

*Primary Examiner* — Julia Slutsker
*Assistant Examiner* — Natalia Gondarenko
(74) *Attorney, Agent, or Firm* — Foley & Lardner LLP

(57) ABSTRACT

A light emitting device which includes: a base body; a conductive member disposed on the base body; a light emitting element placed on the conductive member; and a translucent member disposed above the light emitting element. A surface of the translucent member is formed in a lens shape, and when a portion formed in the lens shape of the translucent member on a surface of the conductive member is perspectively seen from above, an area other than a portion where the light emitting element is placed is coated with an insulating filler to form a light reflection layer.

25 Claims, 5 Drawing Sheets

(56) References Cited

U.S. PATENT DOCUMENTS

| | | | |
|---|---|---|---|
| 7,479,662 B2* | 1/2009 | Soules et al. | 257/98 |
| 8,405,118 B2* | 3/2013 | Chung et al. | 257/99 |
| 2004/0089898 A1* | 5/2004 | Ruhnau et al. | 257/343 |
| 2006/0171152 A1* | 8/2006 | Suehiro et al. | 362/363 |
| 2006/0255355 A1* | 11/2006 | Brunner et al. | 257/98 |
| 2007/0267643 A1* | 11/2007 | Harada et al. | 257/98 |
| 2008/0023713 A1* | 1/2008 | Maeda et al. | 257/98 |
| 2008/0026498 A1 | 1/2008 | Tarsa et al. | |
| 2008/0054287 A1 | 3/2008 | Oshio et al. | |
| 2008/0093606 A1 | 4/2008 | Pan et al. | |
| 2008/0298063 A1 | 12/2008 | Hayashi | |
| 2009/0134414 A1* | 5/2009 | Li et al. | 257/98 |
| 2009/0278149 A1* | 11/2009 | Chang | 257/98 |
| 2010/0078668 A1 | 4/2010 | Kim | |
| 2010/0133571 A1* | 6/2010 | Kawasaki et al. | 257/98 |
| 2010/0327294 A1* | 12/2010 | Chung et al. | 257/88 |
| 2011/0012143 A1* | 1/2011 | Yuan et al. | 257/91 |
| 2011/0012149 A1* | 1/2011 | Basin et al. | 257/98 |
| 2011/0062470 A1* | 3/2011 | Bierhuizen et al. | 257/98 |
| 2011/0241041 A1* | 10/2011 | Greenwood | 257/94 |
| 2011/0291143 A1* | 12/2011 | Kim et al. | 257/98 |
| 2012/0138997 A1 | 6/2012 | Tasaki et al. | |

FOREIGN PATENT DOCUMENTS

| | | | |
|---|---|---|---|
| JP | 2004-172160 | 6/2004 | |
| JP | 2005-159276 A | 6/2005 | |
| JP | 2006-140197 | 6/2006 | |
| JP | 2007-281260 | 10/2007 | |
| JP | 2008-300694 A | 12/2008 | |
| JP | P2009-503888 A | 1/2009 | |
| JP | 2010-219324 | 9/2010 | |
| JP | 2010-238846 | 10/2010 | |
| WO | WO 2007/018560 A1 | 2/2007 | |
| WO | WO 2007/111355 A1 | 10/2007 | |
| WO | WO 2009/075530 A2 | 6/2009 | |
| WO | WO-2009/145298 | 12/2009 | |
| WO | WO 2010/035206 A1 | 4/2010 | |
| WO | WO 2010077082 A2 * | 7/2010 | 257/98 |
| WO | WO 2010/102910 A2 | 9/2010 | |
| WO | WO 2010/150880 A1 | 12/2010 | |
| WO | WO 2011/007275 A1 | 1/2011 | |

OTHER PUBLICATIONS

Japan Patent Office Notification of Reasons for Refusal on application 2011-016420 dispatched Mar. 12, 2014; pp. 1-3.

* cited by examiner

LIGHT EMITTING DEVICE

CROSS REFERENCE TO RELATED APPLICATIONS

This application claims the foreign priority benefit under Title 35, United States Code, §119(a)-(d) of Japanese Patent Application Number 2011-16420, filed on Jan. 28, 2011, the contents of which are hereby incorporated by reference.

BACKGROUND OF THE INVENTION

1. Field of the Invention

The present invention relates to a light emitting device which is applicable to, for example, a display device, lighting equipment, a display and a backlight source of a liquid crystal display.

2. Description of the Related Art

Recently, various kinds of electronic components have been proposed and put into practical use, and the performances required for these components have been also raised high. Especially, regarding the electronic components, the performances are required to be maintained for a long time under a severe environment of usage. The foregoing situation is the same for the light emitting device including a light emitting diode (LED), and the performances to be required in general lighting fields, automotive illumination fields and the like have been raised day by day, and further higher output (high brightness) and higher reliability are expected. Furthermore, the electronic components are required to be supplied at low price, while satisfying the performances.

Generally, the light emitting device includes a base member on which electronic components such as a semiconductor light emitting element (hereinafter, referred to as light emitting element as appropriate) and a protection device are mounted, and conductive members that supply electric power to the electronic components.

Here, in order to fabricate a light emitting device having higher output by increasing light extraction efficiency, it is effective to suppress alight absorption loss due to materials, such as the base member, the conductive members and an encapsulation member.

Therefore, for example, Japanese Patent Publication No. 2007-281260 (Patent Document 1) and Japanese Patent Publication No. 2004-055632 (patent Document 2) propose to suppress the light absorption loss by disposing a reflective resin layer on a surface of the base member, in order to increase the light extraction efficiency.

On the other hand, a light emitting device which is provided with a semispherical convex lens on the side of the light extraction surface in order to increase the light extraction efficiency is also known (for example, Patent Documents 3, 4 below).

PRIOR ART

Patent Document

[Patent Document 1] Japanese Patent Publication No. 2007-281260
[Patent Document 2] Japanese Patent Publication No. 2004-055632
[Patent Document 3] WO 2009/145298
[Patent Document 4] Japanese Patent Publication No. 2006-140197

However, in the method described in Patent Document 1, a high reflective film is molded and adhered to the base member. Therefore, it is difficult to coat a vicinity of the light emitting device without mismatching, while the vicinity is the area that the light reflection is to be maximized. In addition, Patent Document 1 describes that if an additive amount of high reflective powder material to be contained in resin is increased, a moldability of the resin decreases (see paragraph [0022] in Patent Document 1).

In addition, in Patent Document 2, a reflection layer is formed by filling resin containing light reflective filler. However, if an additive amount of light reflective filler is such amount to allow that the resin may be coated and spread, the resin can not reflect the light and an absorption amount of the light by the base member is not small, thereby resulting in insufficient light extraction efficiency.

Even if a convex lens, such as the one described in Patent Documents 3, 4, is disposed in these light emitting devices, it is difficult to extract the light that is absorbed and lost by the base member and the conductive members. Therefore, the effect of improvement of the light extraction efficiency by the lens is not sufficient, and accordingly, a further improvement of the light extraction efficiency is expected.

The present invention has been developed considering the foregoing problems, and it is an object of the present invention to provide a light emitting device that has a translucent member whose surface is formed in a lens shape and has high light extraction efficiency.

SUMMARY OF THE INVENTION

In order to solve the foregoing problems, according to the present invention, there is provided a light emitting device which includes: a base body; a conductive member disposed on the base body; a light emitting element placed on the conductive member; and a translucent member provided above the light emitting element. A surface of the translucent member is formed in a lens shape, and when a portion formed in the lens shape of the translucent member on a surface of the conductive member is perspectively seen from above, an area other than a portion where the light emitting element is placed is coated with an insulating filler to form a light reflection layer.

It is preferable that a portion along a surface of the conductive member and a side face of the light emitting element is coated with the insulating filler.

It is preferable that the conductive member includes an area that is not coated with the filler at outside of the portion formed in the lens shape.

It is preferable that the light emitting device further includes a frame body that is arranged around the light emitting element on the conductive member, and a fluorescent material-containing resin is filled in the frame body.

It is preferable that the filler is impregnated with a resin material.

It is preferable that a refractive index of the filler is higher than a refractive index of the resin material.

It is preferable that a refractive index of the translucent member is higher than the refractive index of the resin material.

It is preferable that a protection device is embedded in the frame body.

According to a support body and a light emitting device of the present invention, the light to be absorbed by the base member and conductive members can be efficiently reflected and extracted outside through a translucent member having a lens shape, and accordingly, the light emitting device having high light extraction efficiency can be obtained.

DETAILED DESCRIPTION OF THE PREFERRED EMBODIMENT

Hereinafter, explanations will be given of embodiments of a support body and a light emitting device according to the present invention by referring to drawings. It is noted that, for example, a size and a positional relationship shown in each drawings may be enlarged for clear explanation. In addition, in the following explanations, the same name or the same symbol basically indicates the same member or the member having the same nature, and the explanation thereof may be omitted as appropriate.

First Embodiment

Figure 1:
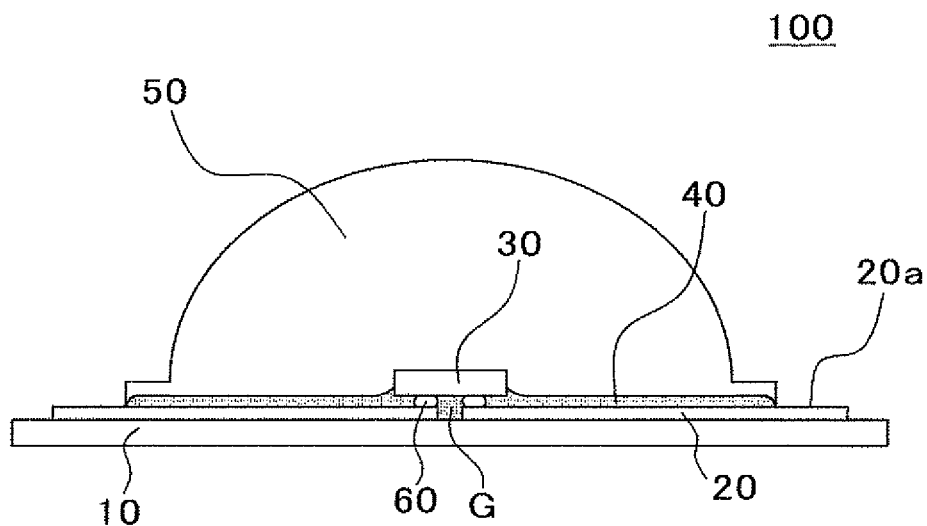
FIG. 1 is a schematic cross sectional view of a light emitting device according to a first embodiment of the present invention.
Figure 2:
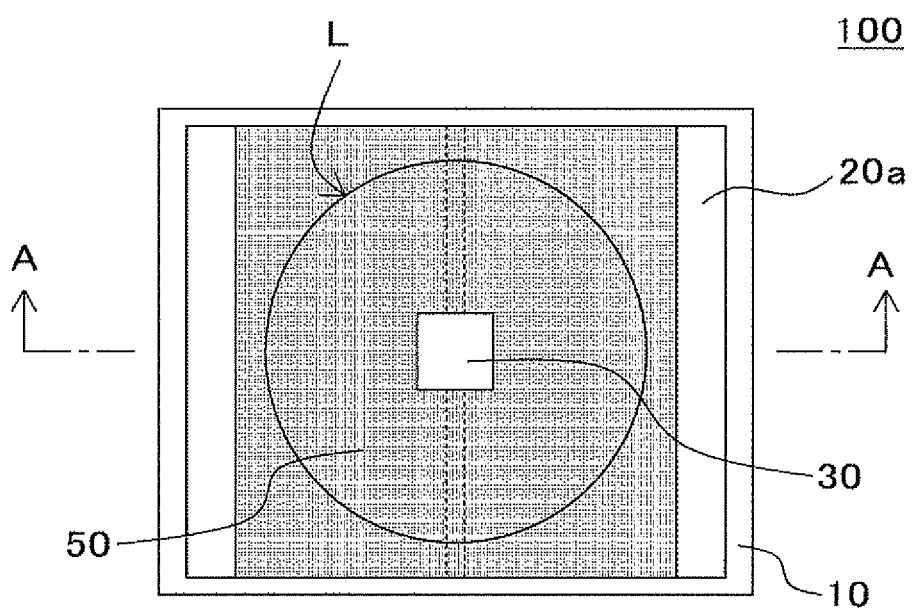
FIG. 2 is a schematic plan view of a light emitting device according to the first embodiment of the present invention.

FIG. 1 is a cross sectional view showing a light emitting device 100 according to a first embodiment of the present invention. FIG. 2 is a plan view showing the light emitting device 100 of FIG. 1, and a cross sectional view taken along A-A' line of FIG. 2 is sown FIG. 1.

The light emitting device 100 of the present embodiment mainly includes a base body 10, a conductive member 20, alight emitting element 30, an insulating filler 40 and a translucent member 50. A surface of the translucent member 50 is formed in a lens shape protruded upward.

The base body 10 has a flat shape, and as shown in FIG. 2, is formed in a rectangular shape in plan view. A pair of conductive members 20 that are separated in a positive part and a negative part in the longitudinal direction are disposed on a main surface of the base body 10. The light emitting element 30 is placed on the conductive member 20 through a conductive bonding member 60 so as to bridge between the separated positive part and the negative part of the conductive member 20. The translucent member 50 is formed above the light emitting element 30, and when a portion that is just below the protruded translucent member 50 formed in the lens shape on the surface of the conductive member 20 is seen from above, an area other than the area where the light emitting element 30 is placed is coated by the insulating filler 40. It is noted that an approximate center of the translucent member 50 that is protruded in a semispherical shape in plan view matches with an approximate center of the base body 10.

According to the foregoing configuration, since a surface of the conductive member 20 formed on the base body 10 is coated by the insulating filler 40 to form a reflective layer, a light traveling toward the base body 10 can be reflected by the filler 40. Therefore, it is not necessarily required to use a specific high reflective material for the conductive member 20, and a stable material for degradation and corrosion may be used for the conductive member 20. In addition, even if the degradation and corrosion are generated in the conductive member 20, since a surface of the conductive member 20 is coated by the filler 40, a light extraction efficiency of the light emitting device can be prevented from lowering.

Here, "a surface of the conductive member 20 is coated by the filler 40 to form a reflective layer" means that a light is reflected to be extracted outside by a layer that is substantially formed by the filler 40, and does not means that the light is substantially reflected by the surface of the conductive member 20.

In addition, a high density light reflection layer can be formed by stacking a layer of the filler 40, instead of containing light reflective members (for example, insulating filler) in a resin to form a resin layer and using the resin layer as a light reflection layer. As a result, a light reflection layer having minimum light transmission may be formed, even if the light reflection layer is a thin layer having a thickness of around 5 to 20 μm.

However, the present embodiment does not exclude a case that the light reflection layer made of filler 40 is impregnated with a resin material that fills spaces among the filler 40.

In addition, in the embodiment, the lower side of a portion that is formed in a convex lens shape is coated by the insulating filler 40 except an area where the light emitting element is mounted. Here, it is sufficient as long as the filler 40 covers at least a surface of the conductive member 20. However, as shown in FIG. 1, it is favorable that a gap G between the conductive members 20 is further coated with the filler 40. Since the conductive member 20 is required to be separated into at least a pair of positive electrode and a negative electrode, the conductive member 20 is disposed separated into two apart from each other on a surface of the base body 10. A light is prevented from leaking though the gap G by coating the gap G with the filler 40, and as a result, the light can be reflected by the filler 40. By coating the gap G with the filler 40 as described above, when a portion of the translucent member 50 formed in a convex shape is seen from above, an area other than the area where the light emitting element 30 is placed is entirely coated with the insulating filler 40. Namely, alight reflection layer made of filler 40 is entirely formed except the area where the light emitting element 30 is placed.

Meanwhile, it is preferable that a width of the gap G is set to not more than 200 μm. If the width of the gap G is not more than 200 μm, it becomes easy to coat the gap with the filler 40. In addition, if the width of the gap G is formed to be not more than 100 μm, the coating of the gap with the filler 40 becomes easier, thereby resulting in more preferable. In addition, with respect to the lower limit, there is no limitation. However, it is preferable that the gap is not less than 30 μm, in view of preventing a contact between electrodes to each other.

By configuring the light emitting device 100 as described above, a light emitted from the light emitting element 30 and traveling toward the conductive member 20 is reflected and extracted outside, thereby resulting in improvement of the light extraction efficiency. In addition, since a surface of the translucent member 50 is formed in a shape of convex lens, the light is hardly returned to the side of the conductive member 20 by the total reflection due to a difference between refractive indexes of the translucent member 50 and air outside the translucent member 50. In the light emitting device according to the embodiment, a surface of the mounting substrate 20 is mostly coated with the insulating filler. Therefore, a light returning to the side of the conductive member 20 by the total reflection depending on the outgoing direction of the light, is reflected again and can be extracted outside, thereby resulting in further improvement of the light extraction efficiency.

Hereinafter, explanation will be given of each component of the light emitting device 100 in detail.

(Base Body 10)

The base body 10 is a member on which the conductive member 20 for placing the light emitting element 30 thereon is disposed. As a material of the base body 10, an insulating member having a certain level of strength is preferable. More specifically, for example, ceramics, phenol resin, epoxy resin, polyimide resin, BT resin, and polyphthalamide (PPA) may be listed up. Specifically, a ceramics which is excellent in heat resistance and light resistance is preferably used. As a ceramics, for example, alumina, mullite, forsterite, glass ceramics, nitride group (for example, AlN), and carbide group (for example, SiC) may be listed up. Especially, a ceramics made of alumina, or mainly made of alumina is preferable.

Meanwhile, when resin is used for the base body 10, inorganic fillers, such as glass fibers, $SiO_2$, $TiO_2$ and $Al_2O_3$ may be mixed with the resin for increasing mechanical strength, for reducing thermal expansion coefficient, and for increasing light reflectance. In addition, a metal member where an insulating portion is partially formed may also be used.

(Conductive Member 20)

The conductive member 20 is a member that is electrically connected to electrodes of the light emitting element 30 and supplies current (electric power) from outside. Namely, the conductive member 20 has a role of electrode or a part of the electrode through which electric power is supplied from outside. Generally, the conductive member 20 is formed separated into at least two of a positive part and a negative part apart from each other. Then, the gap G as shown in FIG. 1 is formed.

The conductive member 20 is formed at least on upper surface of the base body 10 serving as a stage for placing the light emitting element 30. A material of the conductive member 20 may be selected as appropriate depending on, for example, a material used for an insulating member of the base body 10 and fabrication method. For example, when a ceramics is used for a material of the base body 10, it is preferable that the conductive member 20 is made of a material having a high melting temperature that is resistant to a calcinations temperature of the ceramics sheet, and for example, a metal having a high melting temperature, such as tungsten or molybdenum is preferably used. Furthermore, the tungsten or molybdenum may be coated with another metal material using, for example, plating.

In addition, when, for example, a glass epoxy resin is used as a material of an insulating member of the base body 10, it is preferable that a material of the conductive member 20 is an easily workable material. In addition, when an injection-molded epoxy resin is used, it is preferable that a material of the conductive member 20 can be easily worked, for example, in punching, etching and bending, and has a relatively large mechanical strength. Specifically, a metal such as copper, aluminum, gold, silver, tungsten, iron, and nickel, or a metal layer or a leadframe such as iron-nickel alloy, phosphor bronze, iron-containing copper and molybdenum may be listed up. In addition, their surfaces may be further coated with a metal material. The coating metal is not specifically limited, and for example, silver only or silver alloyed with copper, gold, aluminum or rhodium, or a multilayer film using these silver and alloys may be used. In addition, as a method for forming the metal material, for example, sputtering and evaporation may be used in addition to plating. Meanwhile, in the embodiment, since a surface of the conductive member 20 is coated with a filler 40, which will be described later, a lowering of the light extraction efficiency can be suppressed without using a material (for example, silver) which is excellent in reflectivity on the uppermost surface.

(Light Emitting Element 30)

The light emitting element 30 to be mounted on the base body 10 is not specifically limited, and a common device may be utilized. However, in the embodiment, a light emitting diode is preferably used as the light emitting element 30.

The light emitting element 30 having an appropriate wavelength may be selected. For example, as a light emitting element that emits a blue color or a green color, the light emitting element using ZnSe, nitride-based semiconductor ($In_XAl_YGa_{1-X-Y}N$, $0 \leq X$, $X+Y \leq 1$), or GaP may be used. In addition, as a light emitting element that emits a red color, the light emitting element using, for example, GaAlAs or AlInGa may be used. Furthermore, a semiconductor light emitting element using a material other than the foregoing materials may be used. A composition of the material, a color and a size of the light emitting element to be used and the number of light emitting elements may be selected as appropriate depending on the purpose of the application.

In the case that a light emitting device includes a fluorescent material, a nitride semiconductor ($In_XAl_YGa_{1-X-Y}N$, $0 \leq X$, $0 \leq Y$, $X+Y \leq 1$) that is capable of emitting a short wavelength which can efficiently excite the fluorescent material is preferably used. A variety of emission wavelength may be obtained by selecting a material and a level of mixed crystal of the semiconductor layer. A positive electrode and a negative electrode may be on the same side and may be on a different side to each other.

Figure 3A:
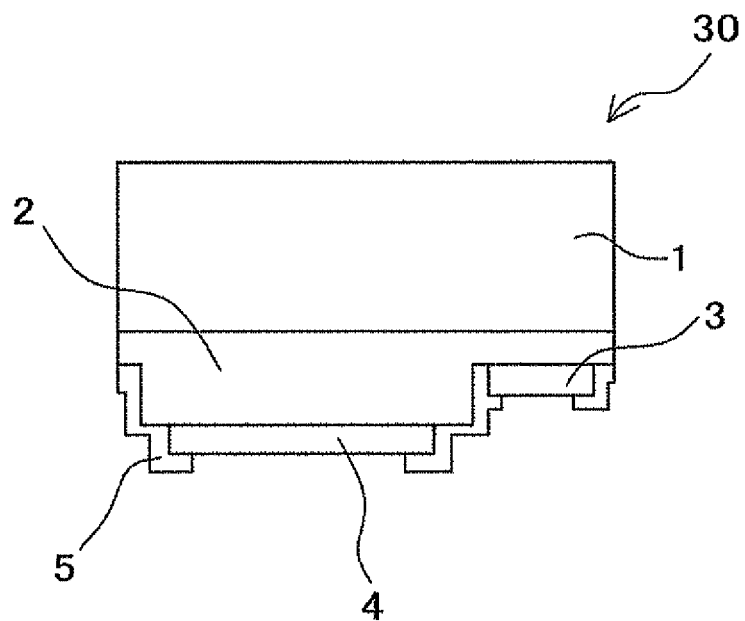
FIG. 3A and FIG. 3B are illustrations showing one example of a light emitting element to be used for a light emitting device according to the present invention.

The light emitting element 30 according to the present embodiment includes a substrate 1 and a semiconductor layer 2 stacked on the substrate 1, as shown in FIG. 3A. In the semiconductor layer 2, an n-type semiconductor layer, an active layer and a p-type semiconductor layer are formed, and a n-electrode 3 is formed on the n-type semiconductor layer and a p-electrode 4 is formed on the p-type semiconductor layer. The substrate 1 is a sapphire substrate and translucent.

Figure 3B:
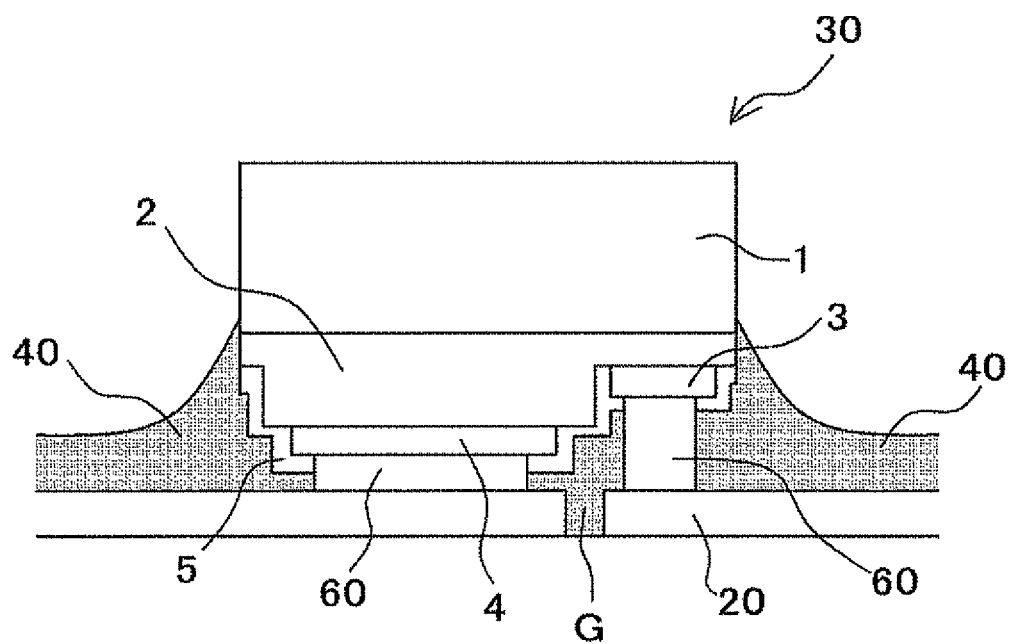

As shown in FIG. 1 and FIG. 3B, the electrodes of the light emitting element 30 are flip-chip mounted on the conductive member 20 on a surface of the base body 10 through a bonding member 60, and a surface facing the surface on which the electrodes are formed, that is, a side of the substrate 1, serves as a light extraction surface. The light emitting element 30 is placed and bonded to the positive part and negative part of the conductive member 20 so as to bridge between the positive part and the negative part of the conductive member 20. As a method for mounting the light emitting element 30, for example, a mounting using a solder paste or bumps may be used. Meanwhile, the light emitting element 30 shown in FIG. 3A and FIG. 3B is shown in more simplified form in other drawings.

As a bonding member 60, a conductive member, specifically, for example, Au-containing alloy, Ag-containing alloy, Pd-containing alloy, In-containing alloy, Pb/Pd-containing alloy, Au/Ga-containing alloy, Au/Sn-containing alloy, Sn-containing alloy, Au/Ge-containing alloy, Au/Si-containing alloy, Al-containing alloy, Cu/In-containing alloy and a mixture of metal and flux may be listed up.

Meanwhile, when the insulator substrate 1 is bonded to thee base body (conductive member), it is not necessarily required to use a conductive member for the bonding member 60, and resin (resin composition) such as insulating epoxy resin and silicone resin may be used.

In addition, as a bonding member 60, any state of liquid, paste and solid (sheet, block, powder) may be used, and may be selected as appropriate depending on, for example, the composition and shape of the base body 10. In addition, the bonding member 60 may be formed by a single member, or may be formed by combination of a couple of members.

Meanwhile, the growth substrate 1 may be removed, and the growth substrate 1 is removed by for, example, polishing or LLO (Laser Lift Off). It is noted that the growth substrate is not limited to the sapphire substrate and may be changed as appropriate.

In addition, it is preferable that the semiconductor layer 2 of the light emitting element 30 is covered by an insulating passivation film 5, as shown in FIG. 3A and FIG. 3B. In this case, it is preferable that the semiconductor layer 2 is exposed at a part of side face of the light emitting element 30 without the passivation film 5, in order to adhere the filler 40 on the side face of the light emitting element 30 by, for example, electrodeposition coating, which will be described alter.

(Translucent Member 50)

The translucent member 50 is disposed above the light emitting element 30. A surface of the translucent member 50 is designed in a convex shape so that a light emitted from the light emitting element 30 can be efficiently extracted outside, that is, designed so that the light is hardly returned to the side of the conductive member 20 by the total reflection due to a difference between refractive indexes of the translucent member 50 and air outside the translucent member 50. A curvature of the lens is designed as appropriate depending on, for example, a desired light distribution and an arrangement of the light emitting element 30.

It is noted that in the specification, "a portion of the translucent member formed in a lens shape" means the portion between a straight line connecting each end of the lens and the surface of the translucent member as seen from a cross section containing the optical axis of the lens and having a maximum curvature of the lens. For example, in FIG. 2, a convex portion within a circle shown by L indicates the portion.

A material of the translucent member 50 is not specifically limited, as long as the material is translucent to a light emitted from the light emitting element. For example, epoxy, silicone, modified silicone, urethane resin, oxetane resin, acrylic, polycarbonate, and polyimide may be used. Furthermore, glass may be used in addition to resin. A filler or diffusing agent may be dispersed in the translucent member 50.

The translucent member 50 made of translucent resin may be formed by using a method of, for example, transfer molding, compression molding and injection molding.

(Filler 40)

The filler 40 is used for coating a surface of the conductive member 20, and has a role to suppress a lowering of the light extraction efficiency. In the embodiment, as shown in FIG. 1, an area other than the area where the light emitting element 30 is placed under a portion of the translucent member 50 formed in a lens shape and within a surface of the conductive member 20 disposed on a surface of the base body 10, is coated with the filler 40.

With respect to the filler 40, if the filler 40 has a white color, light is more likely to be reflected, and as a result, the light extraction efficiency can be improved. In addition, as a material of the filler 40, an inorganic compound is preferably used. Here, a meaning of the white color includes a case that the filler appears as a white color due to diffusion of light by a difference between refractive indexes of the filler and a material surrounding the filler, even if the filler itself is translucent.

Here, it is preferable that a reflectance of the filler 40 is not less than 50% with respect to the emission wavelength, and more preferably not less than 70%. By setting the reflectance as described above, the light extraction efficiency of the light emitting device 100 can be improved.

As a material of such inorganic compound contained in the filler 40, specifically, for example, oxides such as $SiO_2$, $Al_2O_3$, $Al(OH)_3$, $MgCO_3$, $TiO_2$, $ZrO_2$, $ZnO_2$, $Nb_2O_5$, MgO, $Mg(OH)_2$, SrO, $In_2O_3$, $TaO_2$, HfO, SeO and $Y_2O$, nitrides such as SiN, AlN and AlON, and fluorides such as $MgF_2$ may be listed up. Each of these materials may be used alone, may also be used as a mixture thereof, or may be used by forming a stack of these materials.

In addition, it is preferable that a particle size of the filler 40 is in a range of about 1 to 10 μm. By setting the particle size within the range, a coating with the filler 40 becomes easy because the particle size is appropriate for the coating. Meanwhile, the particle size of the filler 40 is preferably in a range of 100 nm to 5 μm, and more preferably 200 nm to 2 μm. In addition, a shape of the filler may be a sphere, or may also be a scale-like shape.

In addition, if a refractive index of the filler 40 is high, a difference between refractive indexes of the filler 40 and the translucent member, which will be impregnated later, may be easily formed, thereby resulting in increase in light scattering, and as a result, the reflectance is improved.

Meanwhile, another translucent member or resin material may further be disposed appropriately between the light emitting element 30 and the translucent member 50. Namely, as long as there exists at least the translucent member 50 whose surface is formed in a lens shape, a layer of another translucent member may be disposed under the translucent member 50. This kind of translucent member has a translucency to allow a light emitted from the light emitting element 30 to pass through. As a specific material of the translucent material, for example, silicone resin, epoxy resin and urea resin may be listed up. In addition to these materials, for example, a colorant, a light diffusion agent, filler and a fluorescent material may be contained as appropriate. For example, if the filler 40 is impregnated with a resin material, adhesiveness of the filler 40 with the conductive member 20 can be improved. Here, the impregnation means a state that the resin material penetrates into spaces among the filler 40.

In addition, a wavelength of a light emitted from the light emitting element 30 may be changed by arranging a resin containing a fluorescent material around the light emitting element 30.

(Other Members)

The light emitting device according to the present embodiment may be provided with other members as appropriate depending on the purpose. For example, in addition to the light emitting element 30, the light emitting device may include a protection device that has a role of a Zener diode. In addition, other than the bonding member 60, the light emitting device may have a structure having a wire for electrical connection.

(Fabrication Method)

Next, explanation will be given of a fabrication method of the light emitting device 100 according to the embodiment in reference to drawings. FIG. 6A to FIG. 6F are cross sectional views showing fabrication processes of the light emitting device 100. In addition, FIG. 6A to FIG. 6F show the fabrication processes of the light emitting device 100 in chronological order, and the light emitting device 100 is basically fabricated according to the order shown in FIG. 6A to FIG. 6F.

The fabrication method of the light emitting device 100 according to the present invention includes a conductive member forming process, a die-bonding process, a filler-coating process and a lens forming process. Hereinafter, explanation will be given for each process.

<Conductive Member Forming Process>

The conductive member forming process is a process for forming the conductive member 20 on the base body 10. In addition, when the conductive member 20 is formed, for example, on the backside of the base body 10, the conductive member 20 is formed according to this process. Namely, this process is the process for disposing the conductive member 20 on at least an upper surface of the base body 10.

For example, when the base body 10 made of ceramics is used, the conductive member 20 can be obtained by burning an unburnt ceramic green sheet which is coated in a predetermined pattern before the burning with a conductive paste containing fine particles of refractory metal such as tungsten and molybdenum. Alternately, the conductive member 20 may be formed on a ceramics material which was burned in advance, and for example, vacuum evaporation, sputtering and plating may be used for forming the conductive member 20.

In addition, when the base body 10 made of glass epoxy resin is used, the conductive member 20 may be formed as follows. A copper plate is pasted on a prepreg that is formed by semi-curing epoxy resin containing a glass fiber clothe or epoxy resin, and the prepreg is thermally cured. After that, a metal member such as copper is patterned in a predetermined shape using photolithography to form the conductive member 20. The conductive member 20 may also be formed using, for example, plating.

In addition, when the base body 10 formed by, for example, injection-molding is used, a leadframe exposed from the base body 10 may be used as the conductive member 20.

<Die-Bonding Process>

Figure 6A:
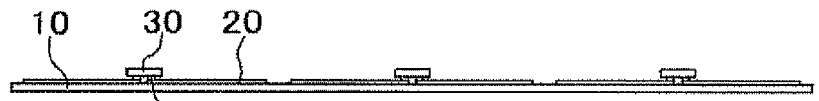
FIG. 6A to FIG. 6F are illustrations showing fabrication processes of a light emitting device according to the first embodiment of the present embodiment.

The die-bonding process is, as shown in FIG. 6A, a process for placing and bonding the light emitting element 30 on the conductive member 20 formed on the base body 10.

The die-bonding process consists of a light emitting element placing process for placing the light emitting element 30 on the base body 10 and a heating process for bonding the light emitting element 30 by heating after the light emitting element 30 is placed.

[Light Emitting Element Placing Process]

The light emitting element placing process is a process for placing the light emitting element 30 on the base body 10 through the bonding member 60. The bonding member 60 includes, for example, a rosin (pine resin) or thermosetting resin, and further, may include a solvent for adjusting viscosity, various kinds of additive agents and an active agent such as organic acid. Furthermore, the bonding member 60 may include metal (for example, metal powder).

The light emitting element 30 is bonded to the conductive member 20 on the base body 10 by the bonding member 60. Meanwhile, a flux may be coated in advance on the backside of the light emitting element 30.

Here, since the bonding member 60 is disposed between the conductive member 20 and the light emitting element 30, the bonding member 60 may be disposed on an area where the light emitting element 30 is placed on the conductive member 20, or may be disposed on the side of the light emitting element 30, or may be disposed on both sides.

Next, explanation will be given of the bonding method.

When a liquid or paste bonding member 60 is disposed on the conductive member 20, a method for disposing the bonding member 60 can be selected as appropriate from, for example, a potting method, a printing method and a transfer method, depending on the viscosity. Then, the light emitting element 30 is placed on the position where the bonding member 60 is disposed. An electrode is formed in advance on the bonding surface of the light emitting element 30, and the electrode is electrically connected to the conductive member 20. Meanwhile, when a solid bonding member 60 is used, the light emitting element 30 can be placed on the conductive member 20 in a similar manner to the case that the liquid or paste bonding member 60 is used, after the sold bonding member 60 is placed. In addition, the light emitting element 30 may be fixed to a desired position on the conductive member 20 by melting the solid or paste bonding member 60 once by, for example, heating.

With respect to a volume of the bonding member 60, it is preferable that the volume is adjusted so that an area of the bonding member 60 is equal to or more than a bonding area of the light emitting element 30, after the light emitting element 30 is bonded. When a plurality of light emitting elements are placed using a liquid or paste resin composition, it is preferable to bond each light emitting element by an independent bonding member, in order to prevent the light emitting element from moving and shifting from a predetermined position due to, for example, a surface tension of the liquid or paste resin composition. Meanwhile, an optimum thickness of the bonding member is different depending on the material of the bonding member. In addition, the bonding member may spread in a lateral direction by being crushed and may follow the irregularity of the base member, when the light emitting element is placed. Therefore, it is required that the volume of the bonding member 60 is adjusted in consideration of the foregoing conditions.

[Heating Process]

The heating process is a process to heat the bonding member 60 after the light emitting element 30 is placed, and to bond the light emitting element 30 on the conductive member 20.

When an insulating substrate of the light emitting element is bonded to the conductive member 20, the bonding member 60 may be an insulating member, and heating in the heating process is conducted at a temperature higher than the temperature at which at least a part of the bonding member 60 vaporizes. In addition, when the bonding member 60 contains a thermosetting resin, it is preferable that the bonding member 60 is heated up at a temperature higher than the temperature at which the thermosetting resin is cured. By setting the conditions as described above, the light emitting element 30 can be bonded and fixed by the thermosetting resin.

In addition, as a bonding member 60, when a resin composition containing, for example, rosin and a metal with a low melting point are used, and if the metal with a low melting point is placed on the conductive member 20, it is preferable that the bonding member 60 is heated up at a temperature higher than the temperature at which the metal with a low melting point melts.

Here, specifically, when the bonding member 60 contains rosin and a metal is disposed on the side of the light emitting element, for example, if a metal film is formed on a sapphire surface of a gallium nitride-based semiconductor device that uses a sapphire substrate, or if a metal film is formed on a silicon surface of a gallium nitride-based semiconductor device that uses a silicon substrate, the conductive member and the metal film form metallic bonding, while the insulating member being removed, by the effect of the rosin component in the bonding member and phenomenon of mutual diffusion of each metal by heating. As a result, the light emitting element can be fixed more firmly, as well as the electric conduction can be achieved.

In addition, following the foregoing heating in the heating process, a cleaning process may be conducted.

For example, when a resin composition is used for the bonding member 60, after a part of the resin component is dispersed through evaporation by heating, the remaining resin composition may be further removed by, for example, cleaning (remaining bonding member cleaning process). Specifically, when the resin composition contains rosin, it is preferable that the cleaning is conducted after the heating. As a cleaning solution, a glycol ether series organic solvent is preferably used.

<Protection Device Bonding Process>

A protection device bonding process is a process for placing and bonding a protection device on the conductive member 20 or the base body 10, as appropriate. Meanwhile, the protection device may be bonded through a metal member that is capable of wire-bonding. The bonding process is preferably conducted concurrently (before or after placing the light emitting element) with the light emitting element placing process.

<Wire-Bonding Process>

A wire-bonding process is a process for connecting an electrode terminal located in upper portion of the protection device and a portion of the conductive member 20 to be an electrode by a wire, as appropriate. A method for connecting the wire is not specifically limited, and a common method may be used. In addition, when the light emitting element 30 has an electrode on the upper surface thereof and is electrically connected, the light emitting element 30 is electrically connected using a wire.

<Filler Coating Process>

A filler coating process is a process for coating an area that is located below a portion of the translucent member 50 to be formed in a lens shape when the translucent member 50 is arranged later on a surface of the conductive member 20, with filler. Meanwhile, an area where the light emitting element is mounted is excluded from the coating.

After the light emitting element 30 is placed by the bonding member 60, a surface of the conductive member 20 on the base body 10 is coated by this process.

In the filler coating process, as shown in FIG. 3B, it is preferable that a part of side face of the light emitting element 30, especially, a portion from a surface of the conductive member 20 to the side face of the light emitting element 30 is coated with the filler 40. This can prevent a light emitted from the light emitting element 30 from coming around below the light emitting element 30, thereby resulting in suppression of lowering of the light output. In this case, when focusing on the coating of the light emitting element 30 with the filler 40, if the entire side face and upper surface of the substrate 1 are coated with a reflecting member in the substrate 1 and the semiconductor layer 2 that configure the light emitting element 30, the light extraction efficiency decreases due to light absorption by the filler 40. Therefore, it is preferable to form the filler 40 so as to expose at least a part of the side face of the substrate 1 as well as the upper surface and to coat a side face of the semiconductor layer 2.

As a method of coating with the filler 40, a film formation method of, for example, electrolytic plating, electrostatic coating and electrodeposition may be used. By using, for example, the electrolytic plating, the electrostatic coating and the electrodeposition, a surface may be selectively coated with the filler. According to these methods, a vicinity of a light emitting element may be preferably coated with the filler without mismatching, unlike with the conventional method that adheres a film in the vicinity of the light emitting element.

The filler coating process consists of a process for arranging the base body 10 on which the light emitting element 30 is placed, for example, in a solution containing the filler and a process for growing the filler on the conductive member 20 by electrophoresis in the solution.

The foregoing method for growing the filler is such a method that an electrode facing the base body 10 is arranged in a solution, and by applying a voltage to the electrode, the filler 40 is grown on a conductive portion by electrophoresis of the charged filler in the solution. An area not to grow the filler is, for example, formed by an insulating member, or masked in advance. In this case, the filler 40 may not grow on the area where the passivation film 5 is formed in the light emitting element 30, in some cases. However, it is preferable that a portion from the surface of the conductive member 20 to the side face of the light emitting element 30 is coated with the filler 40 as shown in FIG. 3B by adjusting the growing condition and time, and as a result, the passivation film formed on the side of the semiconductor layer 2 is also coated with the filler.

Similarly, it is preferable that the gap G between the conductive members is also coated in the filler coating process as shown in FIG. 1.

Here, a thickness of the grown filler 40 may be adjusted as appropriate by adjusting the growing condition and time, and it is preferable that the thickness is at least not less than 5 μm, more preferably, not less than 10 μm.

The filler is made of a material having a high reflectance, then, a light reflection layer is formed by the grown filler 40.

<Conductive Member Mask Process>

Figure 6B:
Figure 6C:
Figure 6D:
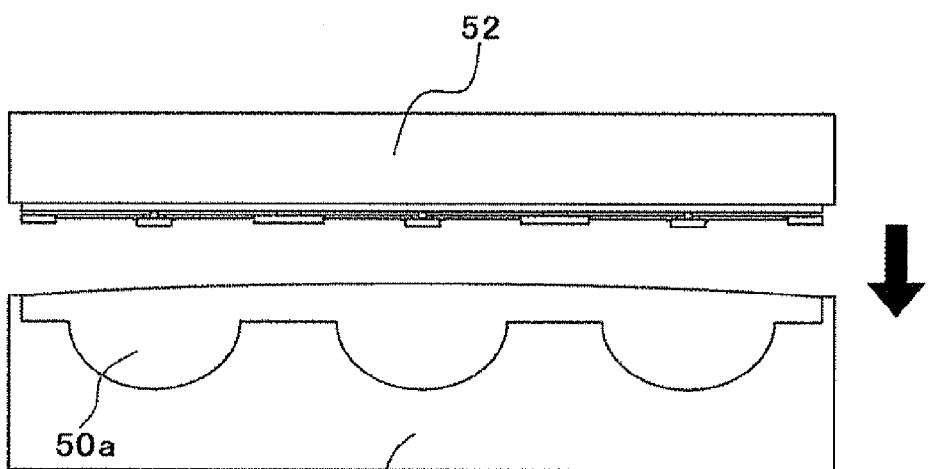

When a part of the conductive member 20 is used as an outer electrode, it is preferable that the filler is electrodeposited after the part is covered by, for example, a mask so that the part is not coated with the filler 40 or the translucent member 50. In the conductive member 20, as shown in FIG. 2 and FIG. 6B, a mask 45 is arranged in a portion 20a located in each end portion of the light emitting device so that the portion 20a is not coated with the filler 40, and as shown in FIG. 6C, an area where the conductive member 20 is exposed is coated with the filler 40. As a result, the outer electrode can be formed outside the portion formed in the lens shape.

It is preferable that a volume percentage of the filler 40 against a resin material to be impregnated is not less than 50%, and more preferably, not less than 65%. In addition, in another point of view, when a cross section of the portion where the filler is grown after the filler is impregnated with the resin material is observed, it is preferable that not less than 50% of the cross section is occupied by the filler 40, and more preferably, not less than 65%.

When a resin material containing filler is used for the coating, if the resin material contains the filler not less than 65% in volume percentage, formability of the resin material decreases. In addition, even if the volume percentage is not more than 65%, a control of resin amount is difficult, and furthermore, it is difficult to arrange/supply a predetermined amount of resin to a desired portion. However, according to the fabrication method of the present embodiment, the filler 40 can be coated in high density and the thickness thereof can be made thin.

Meanwhile, after the filler 40 is formed by the foregoing electrodeposition, a member other than the filler 40 may be formed by electrodeposition.

A compound liquid where the filler is dispersed is used for an electrolytic solution of the electrodeposition. The electrolytic solution is not specifically limited, as long as charged filler can move in the electrolytic solution by receiving electrostatic force.

For example, the electrolytic solution may contain acid or alkali that dissolves the filler, such as nitric acid containing ions (for example $Mg^{2+}$) of alkali-earth metal. In addition, the electrolytic solution may contain metallic alkoxide. Specifically, the electrolytic solution may contain an organic metal material containing an element selected from Al, Sn, Si, Ti, Y and Pb, or alkali-earth metal, as a constituent element. Other than the foregoing electrolytic solution, a compound liquid where the filler is dispersed in sol which is formed by mixing metal alcoholate or metal alkoxide and an organic solvent with a predetermined ratio may be used as the electrolytic solution.

In addition, the electrolytic solution may be a compound liquid which is prepared in such a manner that acetone as an organic solvent, alumina sol as an organic metal material and filler are mixed into a solution containing isopropyl alcohol as a mother liquid.

It is preferable that empty spaces of the filler are impregnated with a resin material after the filler 40 is formed. The resin material may be a member different from the member of the translucent member 50 as a member covering the filler, or the translucent member 50 formed in the lens shape may be formed by the resin material and the filler may be impregnated with the material of the translucent member 50. As a result, adhesiveness between the filler and the translucent member 50 can be improved.

Meanwhile, a refractive index of the filler 40 is preferably set to be higher than the refractive index of the resin material with which the filler 40 is impregnated. By setting a difference between the refractive indexes of the filler 40 and the resin material large, a light scattering effect is improved, and a high reflectance can be obtained.

<Translucent Member (Lens) Forming Process>

A translucent member forming process is a process for forming the translucent member 50 whose surface is formed in a lens shape on the base body 10. The light emitting element 30 and an upper portion of the filler-coated area is covered by the portion formed in the lens shape through this process. Here, explanation will be given of compression molding as an example in reference to FIG. 6D.

Figure 6E:
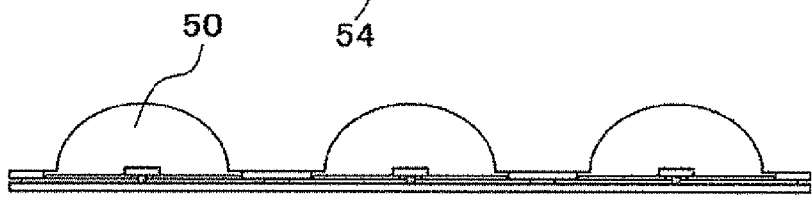
Figure 6F:
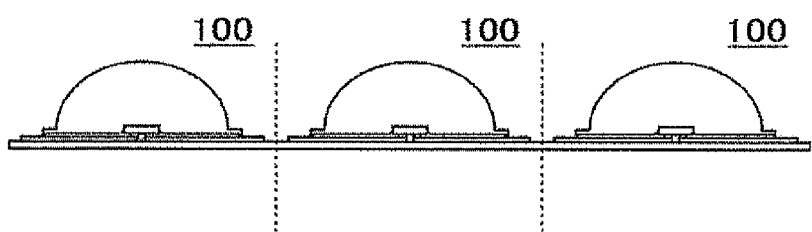

First, the base body 10 is set on an upper mold 52. As a lower mold 54, a mold having a cavity corresponding to the lens shape of the surface of the translucent member 50 is used, and a translucent resin 50a is filled in the cavity. After that, the upper mold and the lower mold are joined and pressed to form a semispherical translucent member 50, as shown in FIG. 6E. Meanwhile, through the foregoing compression molding, as shown in FIG. 6E and FIG. 6F, a thin layer of the resin forming the lens may be formed in a periphery portion of the convex lens in some cases. It is preferable that a portion of the thin layer is coated with the filler 40 as shown in FIG. 2, in order to efficiently reflect a light traveling in the thin layer and to extract the light outside.

In the present embodiment, an electrode 20a of the light emitting device 100 is disposed on the upper side of the base body 10. The electrode 20a is a part of the conductive member 20, and the electrode 20a is formed in such a manner that an end portion of the conductive member is exposed without coating or covering the end portion with the filler 40 and the translucent member 50.

<Mask Removing Process and Cutting Process>

Finally, after the process for forming the translucent member 50 is completed, the mask 45 is removed, the electrode 20a is exposed, the base body 10 is cut and the neighboring light emitting devices are diced, in order to form the light emitting device 100. The light emitting device that is fabricated as described above has the electrode 20a on the upper side, and an area that is located below the translucent member 50 and in which no light emitting element 30 is placed, is coated with the filler 40. As a result, the light emitting device 100 which is excellent in light extraction efficiency can be obtained.

The explanation has been given of the present embodiment. However, the present invention is not limited to the foregoing embodiment and can be modified in various forms without departing from the sprit and scope of the present invention.

Namely, the embodiment of the foregoing light emitting device is an example of a light emitting device for embodying the technological idea of the present invention, and the present invention is not limited to the foregoing embodiment of the light emitting device. In addition, for example, members described in claims are not limited to the embodied members. Especially, for example, a dimension, a shape and a relative distance/arrangement of the constituents described in the embodiment are merely examples for explanation that have no intention to limit the present invention only to them, unless there is a description that limits specifically.

Second Embodiment

In the present embodiment, explanation will be given of an example that arranges a fluorescent material around a light emitting element. The second embodiment is identical to the first embodiment except for the arrangement of the fluorescent material.

Figure 4:
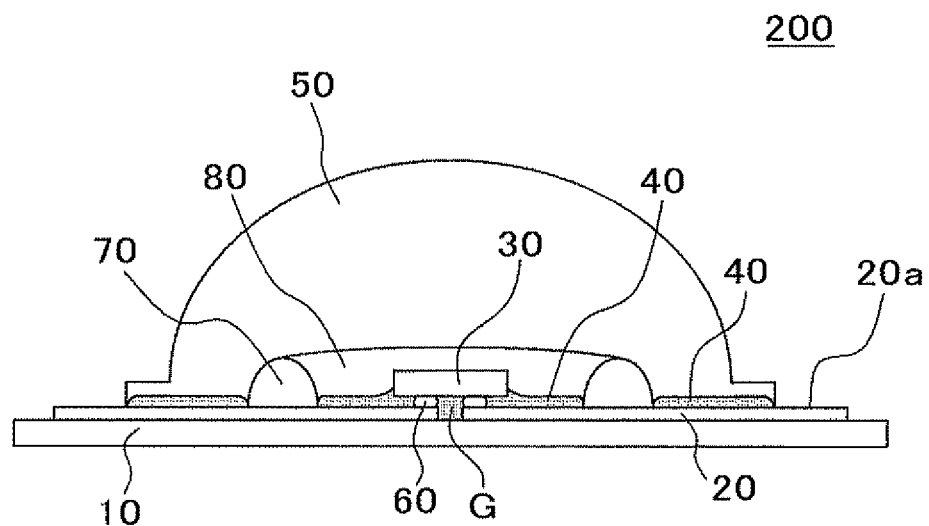
FIG. 4 is a schematic cross sectional view of a light emitting device according to a second embodiment of the present invention.

As shown in FIG. 4, a frame body 70 is disposed on a surface of the conductive member 20 apart from the light emitting element 30. The frame body 70 has a function to fill a fluorescent material-containing resin inside the frame and convert a wavelength of a light emitted from the light emitting element 30.

(Frame Body 70)

It is preferable that the frame body 70 is a member having a light reflecting function, and the member is preferably an insulating material that absorbs light very little and is resistant to light and heat. As a specific material, for example, silicone resin, epoxy resin and urea resin may be listed up. In addition, for example, a colorant, a light diffusion agent, filler and a fluorescent material may be contained in the foregoing material as appropriate.

With respect to a shape of the frame body 70, any shape may be used as long as the frame body 70 is formed so as to surround the light emitting element 30, and for example, a similar figure to the shape of the light emitting element 30, a rectangular shape and a circular shape may be listed up. The frame body 70 is formed around the light emitting element 30, and serves as a dam for damming a fluorescent material-containing resin 80. Therefore, a height of the resin frame is required to be higher than at least the height of the light emitting element 30. When a plurality of light emitting elements are mounted, it is preferable that the plurality of light emitting elements are all mounted within the frame surrounded by the frame. By forming the dam that dams the fluorescent material-containing resin 80 as described above, a luminous point can be made small, and thereby, a color unevenness and a matching with the optical system (for example, lens) can be improved.

The frame body 70 may be formed by using a resin ejection device. A width of a frame body is required to be rather small for suppressing increase in size of a light emitting device.

Therefore, as a material of the frame, a resin having a relatively high viscosity is preferably used.

Meanwhile, the frame body 70 may be formed by pasting a resin sheet which is made of, for example, Teflon (registered trademark) or fluorine-containing rubber and whose one side is coated with an adhesive agent, instead of forming the frame body 70 by ejecting resin.

(Fluorescent Material-Containing Resin 80)

The fluorescent material-containing resin 80 is filled in a concave portion formed by the frame body 70 and an upper surface of the base body 10, and covers at least the light emitting element 30.

As a fluorescent material contained in the resin, any fluorescent material may be used, as long as the fluorescent material absorbs a light emitted from a semiconductor light emitting element formed by semiconductor layers of, for example, nitride-based semiconductor and converts a wavelength of the light into a different wavelength.

As a fluorescent material, for example, a nitride-based fluorescent material and an oxynitride-based fluorescent material that are activated mainly by a lanthanoid element such as Eu and Ce, may be used. More specifically, it is preferable that the fluorescent material is at least one selected from the following descriptions (1) to (3) that are roughly classified.

(1) Fluorescent materials of, for example, alkali earth metal halogen apatite, alkali earth metal borate halogen, alkali earth metal aluminate, alkali earth metal sulfide, alkali earth metal thiogallate, alkali earth metal silicon nitride, and germanate, which are activated mainly by a lanthanoid element such as Eu and a transition metal element such as Mn (2) Fluorescent materials of, for example, rare earth aluminate, rare earth silicate, and alkali earth metal rare earth silicate, which are activated mainly by a lanthanoid element such as Ce (3) Fluorescent material of, for example, organic or organic complexes, which are activated mainly by a lanthanoid element such as Eu Among them, YAG (Yttrium Aluminum Garnet)-based fluorescent material that is a rare earth aluminate fluorescent material which is activated mainly by a lanthanoid element such as Ce described in the foregoing (2), is preferably used. The YAG-based fluorescent material is expressed by the following composition formulae (21) to (24).

$$Y_3Al_5O_{12}{:}Ce \quad (21)$$

$$(Y_{0.8}Gd_{0.2})_3Al_5O_{12}{:}Ce \quad (22)$$

$$Y_3(Al_{0.8}Ga_{0.2})_5O_{12}{:}Ce \quad (23)$$

$$(Y,Gd)_3(Al,Ga)_5O_{12}{:}Ce \quad (24)$$

In addition, in the above fluorescent materials, for example, a part of or all of Y may be substituted with, for example, Tb or Lu. Specifically, $Tb_3Al_5O_{12}{:}Ce$ and $Lu_3Al_5O_{12}{:}Ce$ may be used. Furthermore, a fluorescent material other than the foregoing materials, which has a similar performance, effects and advantages to the foregoing materials may also be used.

As a resin containing a fluorescent material, a resin having a translucency that can transmit a light emitted from the light emitting element 30 is preferably used. As a specific material, for example, silicone resin, epoxy resin, urea resin may be listed up. In addition, for example, a colorant, light diffusion agent and filler may be contained in the foregoing material. Meanwhile, the fluorescent material-containing resin 80 may be formed of a single member, or may be formed of a plurality of layers not less than two layers. In addition, the filling amount is sufficient as long as the light emitting element 30, which is placed in the concave portion formed by the frame body 70 and the upper surface of the base body 10, is covered. Meanwhile, when the fluorescent material-containing resin 80 is designed to have a lens function, a surface of the fluorescent material-containing resin 80 may be swelled up to form a bullet shape or a convex lens shape.

These resins may be filled in the frame body 70 after the filler coating process is completed.

Meanwhile, an outer shape of the frame body 70 is preferably within the area where the translucent member is formed in a lens shape in top perspective view. Namely, by forming a light emitting portion surrounded by the frame body 70 smaller than a diameter of the lens, an incident angle of incoming light at an interface between the lens and air can be made small. As a result, a surface reflection component at the interface can be reduced, thereby resulting in improvement of the light extraction efficiency.

In addition, a light reflection layer made of the filler 40 is also formed outside the frame body 70 across the frame body 70. Therefore, a light returning to a direction of the light emitting element by the reflection at the interface between the lens and air can also be reflected by the layer of the filler 40 that has a high reflectance, thereby resulting in reduction of the light loss.

(Fabrication Method)

A fabrication method of a light emitting device according to the second embodiment is shown in FIG. 7A to FIG. 7H.

The fabrication method of the second embodiment is identical to that of the first embodiment except the following points described below. Therefore, the explanation will be omitted as appropriate.

<Frame Body Forming Process>

Figure 7A:
FIG. 7A to FIG. 7H are illustrations showing fabrication processes of a light emitting device according to the second embodiment of the present embodiment.
Figure 7B:

As shown in FIG. 7A, after the light emitting element 30 is placed as with the first embodiment, the frame body 70 is formed, as shown in FIG. 7B.

A process for forming the frame body 70 is preferably conducted between the die-bonding process and the filler coating process in the fabrication method of the foregoing first embodiment, in order to harden the adhesiveness between the base body 10 and the frame body 70. When a protection device is disposed, the frame body 70 may be formed so as to embed the protection device in the frame body 70. Therefore, a light can be prevented from being absorbed by the protection device.

Meanwhile, the frame body 70 may be formed after the filler is coated.

<Fluorescent Material-Containing Resin Filling Process>

Figure 7C:
Figure 7D:
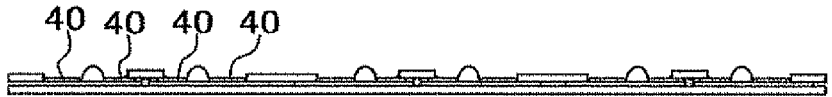
Figure 7E:

As shown in FIG. 7C and FIG. 7D, the mask 45 is arranged as with the first embodiment, and an exposed portion of the conductive member is coated with the filler 40, after that, the fluorescent material-containing resin 80 is filled inside the frame body 70, as shown in FIG. 7E.

Figure 7F:
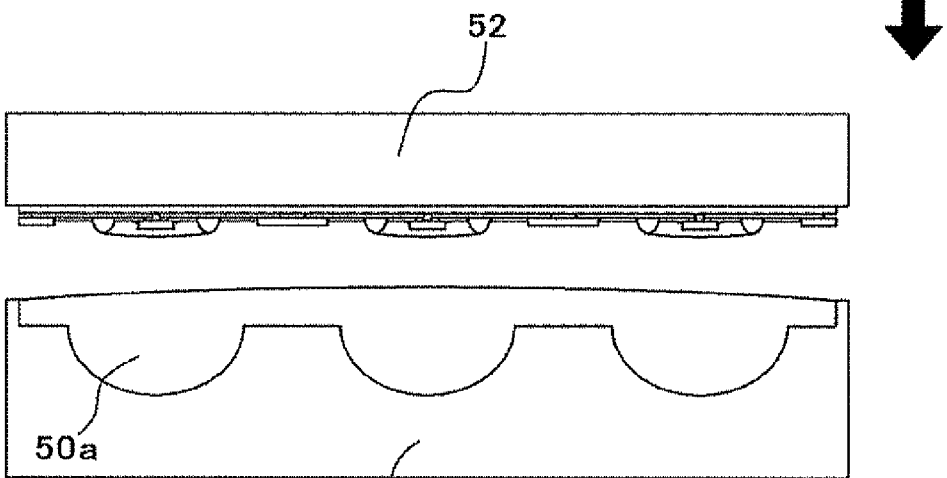
Figure 7G:
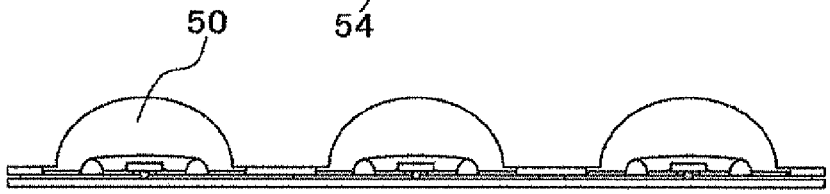
Figure 7H:
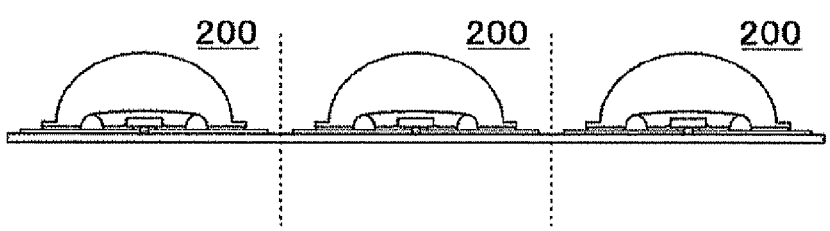

As for the following processes, a lens is formed by the translucent member 50 using compression molding in FIG. 7F and FIG. 7G, and a plurality of light emitting elements are diced into chips in FIG. 7H, as a result, a light emitting element 200 can be obtained as with the first embodiment Third Embodiment In the present embodiment, explanations will be given of an example where materials of a resin material with which the filler is impregnated and a translucent member to be formed into a lens shape are different to each other. The third embodiment is identical to the first embodiment except for the foregoing materials.

Figure 5:
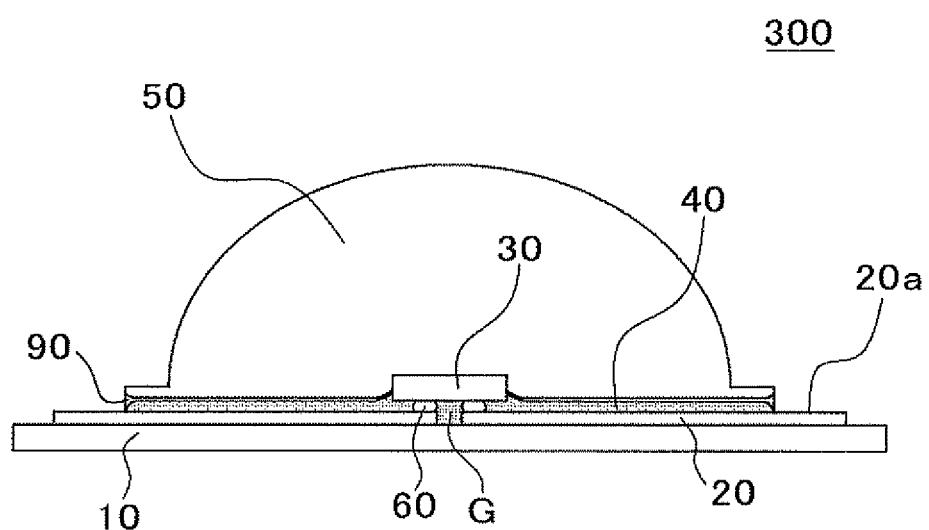
FIG. 5 is a schematic cross sectional view of a light emitting device according to a third embodiment of the present invention.

As shown in FIG. 5, in the present embodiment, the filler 40 is impregnated with the resin material 90, and the filler 40 is further covered by the translucent member 50.

(Resin Material 90)

The resin material 90 is a resin for filling spaces among filler 40. As a specific material, for example, silicone resin, epoxy resin and urea resin may be listed up.

It is preferable that a refractive index of the resin material 90 is set to be smaller than the refractive index of the translucent member 50 that is formed on the resin material 90. Then, a light having an incident angle more than a critical angle corresponding to a difference between refractive indexes of the resin material 90 and the translucent member 50 in the light traveling to the resin material 90 from the translucent member 50 is totally reflected, and as a result, a light absorption loss can be reduced, thereby resulting in further increase in output of the light emitting device.

Meanwhile, the light emitting device may further include the fluorescent material-containing resin 80, as with the second embodiment. In this case, a resin material, a fluorescent material-containing resin and a translucent member are arranged in this order from the side of the substrate within the frame body. In other words, the fluorescent material-containing resin 80 is arranged between the resin material 90 and the translucent member 50.

In this case, it is preferable that refractive indexes of the resin material 90, the fluorescent material-containing resin 80 and the translucent member 50 are set to have the following relation.

resin material 90≤fluorescent material-containing
resin 80≤translucent member 50.

Generally, refractive indexes of the light emitting element 30 and a fluorescent material-containing resin are higher than the refractive index of a resin material. Therefore, it is preferable that the refractive index of the resin material is set to be as high as possible, in order to efficiently extract the light from the light emitting element 30 and the fluorescent material. In addition, when a light enters into a material having a low refractive index from a material having a high refractive index, a degree of reflection at the interface increases as the incident angle increases, and at an incident angle more than a given angle, the light is totally reflected. Due to the these foregoing relations, it is preferable that a refractive index of the resin material 90 is set to be smaller than the refractive index of the fluorescent material-containing resin 80 so that leakage of the light to the side of the base body 10 is minimized.

In addition, in order to minimize interface reflection on the side of the light extraction surface, it is preferable that an incident angle of light entering into an interface, where there is a difference between refractive indexes, is set to be as small as possible. However, the incident angle can not be controlled in the fluorescent material-containing resin 80 because the light is scattered by the fluorescent material. Therefore, it is preferable that a difference between refractive indexes of the fluorescent material-containing resin 80 and the translucent member 50 is set to be small.

Meanwhile, with respect to an incident angle of light entering into the interface between air and the translucent member 50, the incident angle can be made small by forming a curvature of the translucent member 50 to be centered on the fluorescent material-containing resin layer.

Meanwhile, at the outside of the frame body, the resin material and the translucent member are arranged in this order from the side of the substrate.

INDUSTRIAL APPLICABILITY

A light emitting device according to the present invention can suppress a light absorption by the conductive member and other conductive portions as well as transmission of light through them. Therefore, a light emitted from the light emitting element can be efficiently extracted, thereby resulting in improvement of the light extraction efficiency. Therefore, a support body and a light emitting device using the support body according to each present invention can be applied to various kinds of display devices, lighting equipment, a display, a backlight source of liquid crystal display and the like, and further to image reading devices of a facsimile, a copier, a scanner and the like, as well as a projector.

DESCRIPTION OF REFERENCE NUMBER

100, 200, 300 Light emitting device
10 Base body
20 Conductive member
20a Outer electrode
30 Light emitting element
40 Filler
50 Translucent member
50a Translucent resin
60 Bonding member
G Gap
1 Substrate
2 Semiconductor layer
3 n-electrode
4 p-electrode
5 Passivation film
70 Frame body
80 Fluorescent material-containing resin
90 Resin material
45 Mask
52 Upper mold
54 Lower mold

What is claimed is:

1. A light emitting device, comprising:
   a base body;
   at least one conductive member disposed on the base body;
   a light emitting element attached to the at least one conductive member;
   an insulating filler disposed over at least a portion of the at least one conductive member, the insulating filler forming a light reflection layer, the insulating filler being formed as a layer that is distinct from the base body;
   a frame body disposed around the light emitting element on the at least one conductive member;
   a fluorescent material-containing resin filled in the frame body; and
   a translucent member comprising a lens-shaped surface and a flat layer disposed around a periphery of the lens-shaped surface,
   wherein, in a plan view of the light emitting device, the insulating filler covers the conductive member in at least a portion of an area inside the frame body and in at least a portion of an area outside the frame body,
   wherein the fluorescent material-containing resin is disposed on and in direct contact with (i) the light emitting element, (ii) the portion of the insulating filler inside the frame body, and (iii) an inside surface of the frame body, wherein the translucent member is disposed on and in direct contact with (i) the fluorescent material-containing resin, (ii) an outside surface of the frame body, and (iii) the portion of the insulating filler outside the frame body, wherein a portion of the insulating filler is disposed between the base body and the flat layer of the translucent member, and wherein, in a plan view of the light emitting device, the base body extends beyond an outer periphery of the flat layer of the translucent member.

2. The light emitting device according to claim 1, wherein the insulating filler is disposed on at least a portion of a side face of the light emitting element.

3. The light emitting device according to claim 1, wherein, in a plan view of the light emitting device, the insulating filler is not disposed over at least a portion of an area of the at least one conductive member located outside the periphery of the lens-shaped surface.

4. The light emitting device according to claim 1, wherein the insulating filler is impregnated with a resin material.

5. The light emitting device according to claim 4, wherein a refractive index of the insulating filler is higher than a refractive index of the resin material.

6. The light emitting device according to claim 4, wherein a refractive index of the translucent member is higher than a refractive index of the resin material.

7. The light emitting device according to claim 5, wherein a refractive index of the translucent member is higher than the refractive index of the resin material.

8. The light emitting device according to claim 1, wherein a protection device is embedded in the frame body.

9. A light emitting device, comprising:
a base body;
a conductive member disposed on the base body;
a light emitting element placed on the conductive member;
exactly one frame body, which is disposed around the light emitting element on the conductive member;
a fluorescent material-containing resin filled in the frame body; and
a translucent member disposed over the fluorescent material-containing resin, the translucent member comprising a lens-shaped surface and a flat layer disposed around a periphery of the lens-shaped surface; and
an insulating filler disposed over at least a portion of the conductive member, the insulating filler forming a light reflection layer that is distinct from the base body,
wherein, in a plan view of the light emitting device, an entirety of the frame body is disposed within a projected area of the lens-shaped surface of the translucent member onto the conductive member,
wherein, in a plan view of the light emitting device, the insulating filler covers the conductive member in at least a portion of an area inside the frame body and in at least a portion of an area outside the frame body,
wherein a portion of the insulating filler is disposed between the base body and the flat layer of the translucent member, and
wherein, in a plan view of the light emitting device, the base body extends beyond an outer periphery of the flat layer of the translucent member.

10. The light emitting device according to claim 9, wherein the insulating filler is disposed on at least a portion of a side face of the light emitting element.

11. The light emitting device according to claim 9, wherein, in a plan view of the light emitting device, the insulating filler is not disposed over at least a portion of an area of the conductive member located outside the periphery of the lens-shaped surface.

12. The light emitting device according to claim 9, wherein the insulating filler is impregnated with a resin material.

13. The light emitting device according to claim 12, wherein a refractive index of the insulating filler is higher than a refractive index of the resin material.

14. The light emitting device according to claim 12, wherein a refractive index of the translucent member is higher than a refractive index of the resin material.

15. The light emitting device according to claim 13, wherein a refractive index of the translucent member is higher than the refractive index of the resin material.

16. The light emitting device according to claim 9, wherein a protection device is embedded in the frame body.

17. A light emitting device, comprising:
a base body;
a conductive member disposed on the base body;
a light emitting element attached to the conductive member;
an insulating filler disposed over a portion of the conductive member, the insulating filler forming a light reflection layer; and
a translucent member disposed on the light emitting element and on the insulating filler, the translucent member comprising a lens-shaped surface and a flat layer disposed around a periphery of the lens-shaped surface,
wherein, in a plan view of the light emitting device, the insulating filler is disposed on an entirety of a portion of the conductive member that is located between a projected perimeter of the lens-shaped surface of the translucent member onto the conductive member and a projected perimeter of the light emitting element onto the conductive member,
wherein, in a plan view of the light emitting device, the translucent member is disposed on and in direct contact with an entirety of the portion of the insulating filler that is located between a projected perimeter of the lens-shaped surface of the translucent member onto the insulating filler and a projected perimeter of the light emitting element onto the insulating filler,
wherein a portion of the insulating filler is disposed between the base body and the flat layer of the translucent member,
wherein, in a plan view of the light emitting device, an outer periphery of the insulating filler coincides with an outer periphery of the flat layer of the translucent member,
wherein, in a plan view of the light emitting device, the conductive member extends beyond the outer periphery of the insulating filler and the outer periphery of the flat layer of the translucent member, and
wherein, in a plan view of the light emitting device, the base body extends beyond an outer periphery of the conductive member.

18. The light emitting device according to claim 17, wherein the insulating filler is disposed on at least a portion of a side face of the light emitting element.

19. The light emitting device according to claim 17, wherein, in a plan view of the light emitting device, the insulating filler is not disposed over at least a portion of an area of the conductive member located outside the periphery of the lens-shaped surface.

20. The light emitting device according to claim 17, further comprising: a frame body that is arranged around the light emitting element on the conductive member, wherein a fluorescent material-containing resin is disposed within the frame body.

21. The light emitting device according to claim 17, wherein the insulating filler is impregnated with a resin material.

22. The light emitting device according to claim 21, wherein a refractive index of the insulating filler is higher than a refractive index of the resin material.

23. The light emitting device according to claim 21, wherein a refractive index of the translucent member is higher than a refractive index of the resin material.

24. The light emitting device according to claim 22, wherein a refractive index of the translucent member is higher than the refractive index of the resin material.

25. The light emitting device according to claim 20, wherein a protection device is embedded in the frame body.

\* \* \* \* \*